US011848659B2

(12) United States Patent
Hashimoto et al.

(10) Patent No.: US 11,848,659 B2
(45) Date of Patent: Dec. 19, 2023

(54) MANUFACTURING METHOD OF MOUNTING STRUCTURE, AND SHEET THEREFOR

(71) Applicant: NAGASE CHEMTEX CORPORATION, Osaka (JP)

(72) Inventors: Takayuki Hashimoto, Tatsuno (JP); Takuya Ishibashi, Tatsuno (JP); Hiroyuki Okada, Tatsuno (JP); Kazuki Nishimura, Tatsuno (JP)

(73) Assignee: NAGASE CHEMTEX CORPORATION, Osaka (JP)

( * ) Notice: Subject to any disclaimer, the term of this patent is extended or adjusted under 35 U.S.C. 154(b) by 937 days.

(21) Appl. No.: 16/651,833

(22) PCT Filed: Sep. 28, 2018

(86) PCT No.: PCT/JP2018/036283
§ 371 (c)(1),
(2) Date: Mar. 27, 2020

(87) PCT Pub. No.: WO2019/065977
PCT Pub. Date: Apr. 4, 2019

(65) Prior Publication Data
US 2020/0266797 A1 Aug. 20, 2020

(30) Foreign Application Priority Data
Sep. 29, 2017 (JP) ................................. 2017-191945

(51) Int. Cl.
*H03H 9/10* (2006.01)
*B29C 51/12* (2006.01)
(Continued)

(52) U.S. Cl.
CPC ............ *H03H 9/1085* (2013.01); *B29C 51/12* (2013.01); *B29C 51/14* (2013.01); *B32B 27/08* (2013.01);
(Continued)

(58) Field of Classification Search
CPC .......... H03H 3/08; H03H 9/10; H03H 9/1085; H10N 30/02; H10N 30/88; H10N 30/883;
(Continued)

(56) References Cited

U.S. PATENT DOCUMENTS

2004/0213973 A1    10/2004  Hara et al.
2017/0117874 A1     4/2017  Ishibashi et al.

FOREIGN PATENT DOCUMENTS

CN      105453253 A      3/2016
CN      107039360 A      8/2017
(Continued)

OTHER PUBLICATIONS

Tranlsation of JP 2015035567 provided by Search FIT database (Year: 2015).*
(Continued)

*Primary Examiner* — Peter Dungba Vo
*Assistant Examiner* — Jushua D Anderson
(74) *Attorney, Agent, or Firm* — Sughrue Mion, PLLC

(57) ABSTRACT

A manufacturing method of a mounting structure, the method including: a step of preparing a mounting member including a first circuit member and a plurality of second circuit members placed on the first circuit member; a step of preparing a sheet having thermosetting property; a disposing step of disposing the sheet on the mounting member so as to face the second circuit members; and a sealing step of pressing the sheet against the first circuit member and heating the sheet, to seal the second circuit members and to cure the sheet, wherein the second circuit members include (Continued)

a reference member, and a first adjacent member and a second adjacent member each adjacent to the reference member, a separation distance D1 between the reference member and the first adjacent member is different from a separation distance D2 between the reference member and the second adjacent member, at least one of the plurality of the second circuit members is a hollow member to be provided with a space from the first circuit member, and in the sealing step, the plurality of the second circuit members are sealed so as to maintain the space.

4 Claims, 3 Drawing Sheets

(51) Int. Cl.
  *B29C 51/14* (2006.01)
  *B32B 27/08* (2006.01)
  *H03H 9/05* (2006.01)
  *H05K 3/28* (2006.01)
  *H10N 30/02* (2023.01)
  *H10N 30/88* (2023.01)
  *H10N 30/87* (2023.01)
  *B29K 101/10* (2006.01)
  *B29L 31/34* (2006.01)

(52) U.S. Cl.
  CPC ............. *H03H 9/059* (2013.01); *H05K 3/284* (2013.01); *H10N 30/02* (2023.02); *H10N 30/875* (2023.02); *H10N 30/88* (2023.02); *H10N 30/883* (2023.02); *B29K 2101/10* (2013.01); *B29L 2031/34* (2013.01); *Y10T 29/49146* (2015.01)

(58) Field of Classification Search
  CPC .......... H05K 3/28; H05K 3/281; H05K 3/284; H05K 3/285; H05K 3/287; H05K 3/4632; H05K 2203/06; H05K 2203/061; H05K 2203/065; B32B 27/08; H01L 21/56; H01L 21/561; H01L 23/28; H01L 23/29; H01L 23/293; H01L 23/295; H01L 23/3121; H01L 23/3135; H01L 23/315; Y10T 29/49146; Y10T 29/49158; Y10T 29/4916

See application file for complete search history.

(56) References Cited

FOREIGN PATENT DOCUMENTS

| | | | |
|---|---|---|---|
| EP | 3 706 164 A1 | 9/2020 | |
| JP | 2004-327623 A | 11/2004 | |
| JP | 2008-098419 A | 4/2008 | |
| JP | 2015035567 A * | 2/2015 | ......... H01L 23/3128 |
| JP | 2015-053470 A | 3/2015 | |
| JP | 2015-106573 A | 6/2015 | |
| JP | 2015-179814 A | 10/2015 | |
| JP | 2015-221499 A | 12/2015 | |
| JP | 2016-32008 A | 3/2016 | |
| JP | 2017-092103 A | 5/2017 | |
| JP | 2017-108183 A | 6/2017 | |
| TW | 201601260 A | 1/2016 | |
| TW | 201635446 A | 10/2016 | |
| WO | 2013/121689 A1 | 8/2013 | |
| WO | 2015/019846 A1 | 2/2015 | |

OTHER PUBLICATIONS

Office Action dated Mar. 2, 2023 from the Chinese Patent Office in CN Application No. 201880060753.8.
Extended European Search Report dated Jan. 15, 2021 by the European Patent Office in European application No. 18862358.1.
International Search Report for PCT/JP2018/036283 dated Dec. 4, 2018 [PCT/ISA/210].
International Preliminary Examination Report for PCT/JP2018/036283 dated Oct. 15, 2019 [PCT/IPEA/409].
Office Action dated Aug. 30, 2022 issued by the Korean Patent Office in Korean Application No. 10-2020-7007628.
Taiwanese Office Action issued in the corresponding Taiwanese Patent Application No. 107134551, dated Sep. 6, 2021.

* cited by examiner

MANUFACTURING METHOD OF MOUNTING STRUCTURE, AND SHEET THEREFOR

CROSS REFERENCE TO RELATED APPLICATIONS

This application is a National Stage of International Application No. PCT/JP2018/036283 filed Sep. 28, 2018, claiming priority based on Japanese Patent Application No. 2017-191945 filed Sep. 29, 2017.

TECHNICAL FIELD

The present invention relates to a manufacturing method of a mounting structure, specifically to a manufacturing method of a sealed mounting structure, and a sheet used for sealing.

BACKGROUND ART

Some electronic components (circuit members) placed on a circuit board needs a space from the circuit board. One example is a SAW chip used for noise cancellation in cellular phones and other devices. The SAW chip filters a desired frequency by utilizing a surface acoustic wave that propagates on a piezoelectric substrate (piezoelectric body). Therefore, a space is necessary between the electrodes on the piezoelectric body and the circuit board on which the SAW chip is placed. For sealing such a circuit member (hollow member) with a space from the circuit board (internal space), a sheet-like sealing material (hereinafter, a sheet) is sometimes used.

Furthermore, with recent miniaturization of electronic devices, miniaturization of circuit boards has been required, and the distance between a plurality of circuit members (including hollow members) placed on a circuit board has been getting narrower. For sealing such circuit members with a sheet, the sheet is required to have physical properties that enable it to enter a narrow gap between the circuit members while not entering the internal space. In this regard, Patent Literature 1 discloses a sheet having different entry speeds such that the ratio of an entry speed between circuit members arranged at an interval of 100 μm to an entry speed into an internal space having a height of 20 μm from the circuit board is large.

CITATION LIST

Patent Literature

[PTL 1] Japanese Laid-Open Patent Publication No. 2015-106573

SUMMARY OF INVENTION

Technical Problem

The size, shape, and arranged intervals of circuit members placed on a circuit board are diverse. When such a plurality of circuit members are sealed with a sheet, the behavior of the sheet when entering the gap between the circuit members is influenced, in particular, by the length of the interval between the circuit members. Furthermore, the behavior of the sheet when entering the gap between the circuit members is different from that when going to enter the internal space. Therefore, even when using the sheet disclosed in Patent Literature 1, it is difficult to collectively seal a plurality of circuit members arranged at various intervals, so as to maintain the internal space.

Solution to Problem

In view of the above, one aspect of the present invention relates to a manufacturing method of a mounting structure, the method including: a step of preparing a mounting member including a first circuit member and a plurality of second circuit members placed on the first circuit member; a step of preparing a sheet having thermosetting property; a disposing step of disposing the sheet on the mounting member so as to face the second circuit members; and a sealing step of pressing the sheet against the first circuit member and heating the sheet, to seal the second circuit members and to cure the sheet, wherein the second circuit members include a reference member, and a first adjacent member and a second adjacent member each adjacent to the reference member, a separation distance D1 between the reference member and the first adjacent member is different from a separation distance D2 between the reference member and the second adjacent member, at least one of the plurality of the second circuit members is a hollow member to be provided with a space from the first circuit member, and in the sealing step, the plurality of the second circuit members are sealed so as to maintain the space.

Another aspect of the present invention relates to a sheet for sealing a mounting member including a first circuit member and a plurality of second circuit members placed on the first circuit member, the sheet including: a layer formed of a resin composition containing a thermosetting resin, wherein the resin composition has, at a temperature t when the second circuit members are sealed, a loss tangent tan δ of 0.1 or more and 0.8 or less, and a storage shear modulus of $1\times10^4$ Pa or more and $1\times10^7$ Pa or less, the second circuit members include a reference member, and a first adjacent member and a second adjacent member each adjacent to the reference member, a separation distance D1 between the reference member and the first adjacent member is different from a separation distance D2 between the reference member and the second adjacent member, and at least one of the plurality of the second circuit members is a hollow member to be provided with a space from the first circuit member.

Advantageous Effects of Invention

According to the present invention, a plurality of circuit members including a hollow member and arranged at different intervals can be collectively sealed so as to maintain the internal space.

DESCRIPTION OF EMBODIMENTS

Figure 1:
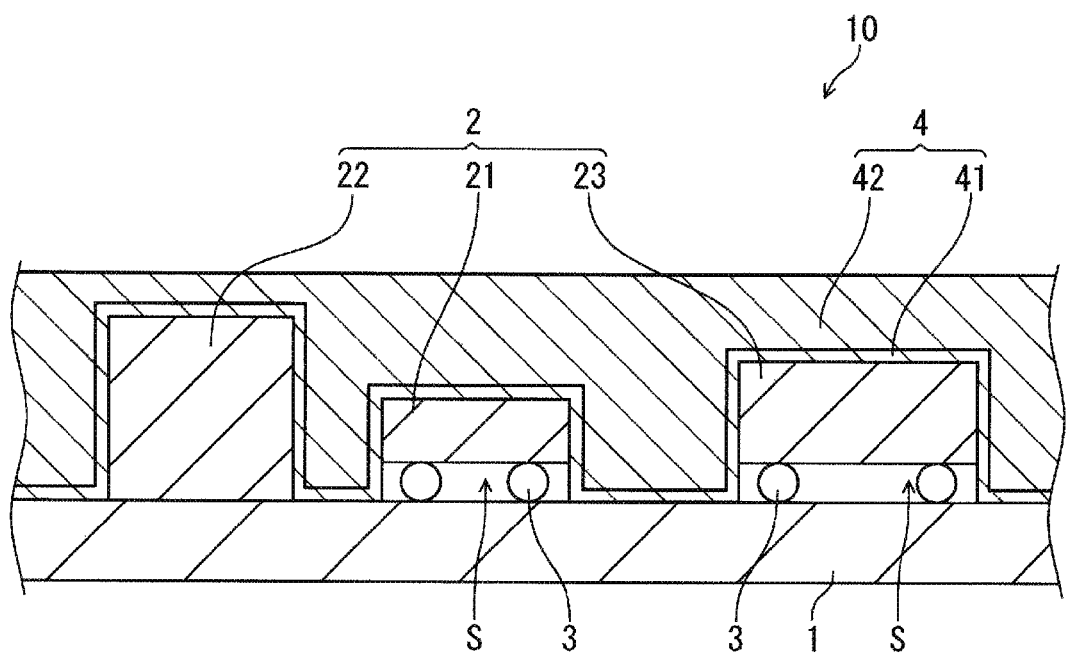
FIG. 1 A schematic cross-sectional view of a mounting structure according to an embodiment of the present invention.

An example of a mounting structure manufactured by a method according to the present embodiment is shown in FIG. 1. FIG. 1 is a schematic cross-sectional view of a mounting structure 10.

The mounting structure 10 includes a first circuit member 1, a plurality of second circuit members 2 placed on the first circuit member 1, and a sealing material 4 sealing the second circuit members 2. At least one of the plurality of the second circuit members 2 is a hollow member provided with a space (internal space S) from the first circuit member 1. The sealing material 4 is a cured product of a sheet 4P (cf., FIG. 2). The present invention encompasses the sheet 4P. The sealing material 4 includes a first cured layer 41 and a second cured layer 42. The first cured layer 41 and the second cured layer 42 are cured products of later described first layer 41P and second layer 42P, respectively. The sheet 4P is an uncured or semi-cured product, and the first and second layers 41P and 42P are also each an uncured or semi-cured product.

Although the second circuit members 2 are placed on the first circuit member 1 with bumps 3 interposed therebetween in the present embodiment, the placing way on the first circuit member 1 is not limited thereto. Although the sheet 4P in the illustrated example is a laminate having two layers, it is not limited thereto.

Figure 2:
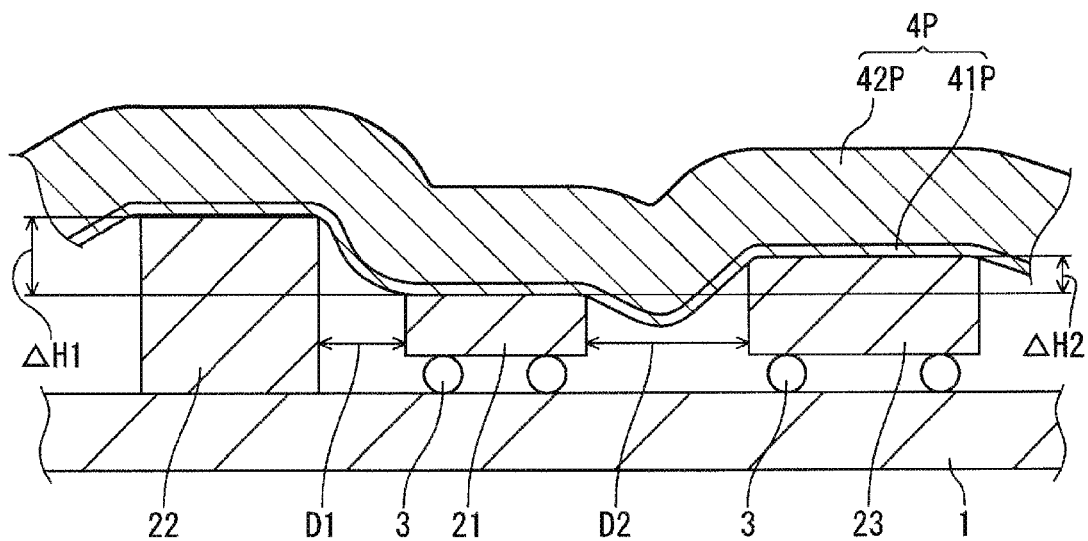
FIG. 2 A schematic cross-sectional view of each circuit member and a sheet in a sealing step according to an embodiment of the present invention.

The second circuit members 2 include a reference member 21, a first adjacent member 22 adjacent to the reference member 21, and a second adjacent member 23 adjacent to the reference member 21. Here, as illustrated in FIG. 2, a separation distance D1 between the reference member 21 and the first adjacent member 22 is different from a separation distance D2 between the reference member 21 and the second adjacent member 23. At least one of the second circuit members 2 is a hollow member to be placed on the first circuit member 1 with the bumps 3 interposed therebetween (in the illustrated example, the reference member 21 and the second adjacent member 23). FIG. 2 is a schematic cross-sectional view of each circuit member and the sheet 4P in the sealing step.

[Sheet]

The sheet 4P is a member that collectively seals the plurality of the second circuit members 2.

According to the sheet 4P, the plurality of the second circuit members 2 including a hollow member and placed at various intervals can be collectively sealed, so as to maintain the internal space S of the hollow member. In other words, the plurality of second circuit members 2 can be sealed by one kind or one piece of the sheet 4P Usually, the smaller the separation distance is, the more unlikely a sealing sheet is to enter the gap between the circuit members. The sheet 4P, however, has an elasticity that does not allow it to enter the internal space S and a viscosity that allows it to enter between the second circuit members 2 and extend, regardless of whether the separation distance is large and small.

In the sealing step, the sheet 4P first comes in close contact with surfaces facing the sheet 4P (upper surfaces) of the second circuit members 2. The sheet 4P then extends toward the first circuit member 1 along the outer profile of the second circuit members 2. At this time, due to its viscosity, the sheet 4P can enter between the second circuit members 2, even where the separation distance therebetween is small. Furthermore, the sheet 4P can extend within the narrow gap, toward the first circuit member 1. The extended sheet 4P eventually reaches the surface of the first circuit member 1. On the other hand, after reaching the surface of the first circuit member 1, the elasticity acts, and the sheet 4P is unlikely to enter the internal space S.

Moreover, when using the sheet 4P as above, even though the plurality of the second circuit members 2 have different heights from the first circuit member 1, the plurality of the second circuit members 2 can be collectively sealed, so as to maintain the internal space S of the hollow member. The sheet 4P has a viscosity that allows it to extend within a small gap, toward the first circuit member 1. Therefore, once the sheet 4P can enter between the second circuit members 2, the sheet 4P can extend until reaching the surface of the first circuit member 1, regardless of the heights of the second circuit members 2.

Here, whether the sheet 4P enters the internal space S and between the second circuit member 2 or not tends to be dependent on the viscoelasticity of the sheet 4P at a temperature t when the second circuit members 2 are sealed. Therefore, the loss tangent tan δ of the sheet 4P and the storage shear modulus G' at the temperature t may be controlled within a specific range.

For example, the sheet 4P is configured to include a layer formed of a resin composition having a loss tangent tan δ of 0.1 or more and 0.8 or less and a storage shear modulus G' of $1 \times 10^4$ Pa or more and $1 \times 10^7$ Pa or less at the temperature t when the second circuit members 2 are sealed (hereinafter, a flow control layer). This can make it easy to collectively seal the plurality of the second circuit members 2 differing in separation distance and further in height, so as to maintain the internal space S.

The resin composition constituting the flow control layer (hereinafter, a flow control resin) may have a loss tangent tan δ at the temperature t of 0.2 or more. The loss tangent tan δ may be 0.6 or less, and may be 0.5 or less. The storage shear modulus G' at the temperature t of the flow control resin may be $1 \times 10^4$ Pa or more, and may be $5 \times 10^4$ Pa or more. The storage shear modulus G' at the temperature t of the flow control resin may be $5 \times 10^6$ Pa or less, and may be $1 \times 10^6$ Pa or less.

The temperature t when the second circuit members 2 are sealed is a temperature of the sheet 4P when the surfaces of the second circuit members 2 are covered with the sheet 4P, with the internal space S maintained. The temperature of the sheet 4P can be replaced with a setting temperature of a heating means for heating the sheet 4P in the sealing step. When the heating means for the sheet 4P is a press machine, the setting temperature of the heating means is a setting temperature of the press machine. When the heating means for the sheet 4P is a heater for heating the first circuit member 1, the setting temperature of the heating means is a setting temperature of the heater for the first circuit member 1. The temperature t can be changed according to, for example, the material of the sheet 4P, and may be, for example, between room temperature +15° C. (40° C.) and 200° C. Specifically, the temperature t is, for example, 50° C. or higher and 180° C. or lower. When the second circuit members 2 are sealed, the sheet 4P may be in an uncured state or in a semi-cured state.

The loss tangent tan δ1 is a ratio: G"/G' of a loss shear modulus (G") to a storage shear modulus G' of each layer at the temperature t. The storage shear modulus G' and the loss shear modulus G" can be measured with a rheometer complying with JIS K 7244. Specifically, the storage shear modulus G' and the loss shear modulus G" can be measured on a test piece of 8 mm in diameter×1 mm, using a rheometer (e.g., ARES-LS2, available from TA instruments, Inc.) at a frequency of 1 Hz and a temperature rise rate of 10° C./min.

An elongation percentage E of the flow control resin is not limited. For example, an elongation percentage $E_t$ at the temperature t of a layer formed of the flow control resin and having a thickness of 100 μm may be 50% or more, and may be 200% or more. This allows the sheet 4P to easily enter between the second circuit members 2. The elongation percentage $E_t$ may be 3000% or less. An elongation percentage $E_{25}$ at 25° C. of the above layer is also not limited, but may be, for example, 50% or more and 3000% or less. Note that although a sample having a thickness of 100 μm is used to measure the elongation percentage, the thickness of the actual flow control layer or later described first and second layers can be less than 100 μm, and can be 100 μm or more.

The elongation percentage E is calculated as below. For example, using a rheometer (e.g., ARES-LS2, available from TA instruments, Inc.), a tensile stress is applied to a sample under the following conditions. An elongation percentage of the sample when a crack occurs in the sample is measured. The tensile test is performed at the temperature of t or 25° C. Five samples are measured, and their average is referred to as the elongation percentage E.

Jig: Extensional Viscosity Fixture
Sample: length 30 mm, width 10 mm, thickness 100 μm
Shear rate: $0.1\ s^{-1}$ In view of electrical insulation, the volumetric resistivity of the whole sheet 4P may be $1\times10^8$ Ω·cm or more, and may be $1\times10^{10}$ Ω·cm or more.

An overall thickness T of the sheet 4P is not limited. In view of facilitating the entry between the second circuit members 2 even when the separation distance therebetween is small, and reducing the height of the mounting structure 10, the thickness T may be 50 μm or more, and may be 200 μm or more. In view of bringing into close contact with the surfaces of the second circuit members 2, the thickness T may be 1500 μm or less, may be 1000 μm or less, and may be 500 μm or less. The thickness T of the sheet 4P is a distance between the principal surfaces of the sheet 4P. The distance between the principal surfaces can be determined by averaging the distances at 10 randomly selected points. A thickness of the flow control layer, a thickness T1 of the first layer, and a thickness T2 of the second layer can be determined in a similar manner to the above.

The flow control resin is composed of a resin composition containing a thermosetting resin and a curing agent.

The thermosetting resin before sealing may be in an uncured state or in a semi-cured state. The semi-cured state means a state in which the thermosetting resin includes a monomer and/or an oligomer, and the development of three-dimensional cross-linked structure of the thermosetting resin is insufficient. The semi-cured thermosetting resin is in a so-called B stage, i.e., a state in which the resin does not dissolve in a solvent at room temperature (25° C.) but is not cured completely.

Examples of the thermosetting resin include, but not limited to, epoxy resin, (meth)acrylic resin, phenol resin, melamine resin, silicone resin, urea resin, urethane resin, vinyl ester resin, unsaturated polyester resin, diallyl phthalate resin, and polyimide resin. These may be used singly or in combination of two or more kinds thereof. Preferred is an epoxy resin.

Examples of the epoxy resin include, but not limited to, bisphenol A-type epoxy resin, bisphenol F-type epoxy resin, bisphenol AD-type epoxy resin, hydrogenated bisphenol A-type epoxy resin, hydrogenated bisphenol F-type epoxy resin, phenol novolac-type epoxy resin, naphthalene-type epoxy resin, alicyclic aliphatic epoxy resin, and glycidyl ethers of organic carboxylic acids. These may be used singly or in combination of two or more kinds thereof. The epoxy resin may be a prepolymer or may be a copolymer of an epoxy resin, such as polyether-modified epoxy resin or silicone-modified epoxy resin, and another polymer. Preferred are a bisphenol AD-type epoxy resin, a naphthalene type epoxy resin, a bisphenol A-type epoxy resin, and/or a bisphenol F-type epoxy resin. Particularly preferred are a bisphenol A-type epoxy resin and a bisphenol F-type epoxy resin because of their excellent heat resistance and water resistance and their inexpensive prices.

For viscosity adjustment of the resin composition, the epoxy resin can include a monofunctional epoxy resin having one epoxy group in its molecule, in an amount of approximately 0.1 mass % or more and 30 mass % or less in the whole epoxy resin. Examples of the monofunctional epoxy resin include phenylglycidyl ether, 2-ethylhexyl glycidyl ether, ethyldiethylene glycol glycidyl ether, dicyclopentadiene glycidyl ether, and 2-hydroxyethyl glycidyl ether. These may be used singly or in combination of two or more kinds thereof.

The resin composition includes a curing agent for the thermosetting resin. Examples of the curing agent include, but not limited to, a phenolic curing agent (e.g., phenol resin), a dicyandiamide-based curing agent (e.g., dicyandiamide), a urea-based curing agent, an organic acid hydrazide-based curing agent, a polyamine salt-based curing agent, an amine adduct-based curing agent, an acid anhydride-based curing agent, and an imidazole-based curing agent. These may be used singly or in combination of two or more kinds thereof. The kind of the curing agent may be selected as appropriate according to the thermosetting resin. Preferred is a phenol-based curing agent because of its low outgassing during curing, moisture resistance, and heat cycle resistance.

The amount of the curing agent differs depending on the kind of the curing agent. When an epoxy resin is used, for example, the curing agent is preferably used in an amount such that the functional group equivalent of the curing agent is 0.001 eq or more and 2 eq or less, and further 0.005 eq or more and 1.5 eq or less, per one equivalent of the epoxy group.

The dicyandiamide-based curing agent, the urea-based curing agent, the organic acid hydrazide-based curing agent, the polyamine salt-based curing agent, and the amine adduct-based curing agent are latent curing agents. The activation temperature of the latent curing agent is preferably 60° C. or higher, and further 80° C. or higher. The activation temperature is preferably 250° C. or lower, and further 180° C. or lower. This can provide a resin composition that can cure quickly at a temperature equal to or higher than the activation temperature.

The resin composition may contain a third component other than the above. Examples of the third component include a thermoplastic resin, an inorganic filler, a curing accelerator, a polymerization initiator, an ion catcher, a flame retardant, a pigment, a silane coupling agent, and a thixotropic agent.

The thermoplastic resin can be blended as a sheeting agent. The resin composition, by being formed into a sheet, exhibits improved handleability in the sealing process and is unlikely to cause dripping or other inconveniences. This serves to maintain the internal space S.

The thermoplastic resin may be of the following kind: for example, acrylic resin, phenoxy resin, polyolefin, polyurethane, block isocyanate, polyether, polyester, polyimide, polyvinyl alcohol, butyral resin, polyamide, vinyl chloride, cellulose, thermoplastic epoxy resin, and thermoplastic phenol resin. Preferred is an acrylic resin because it functions well as a sheet-forming agent. The amount of the thermoplastic resin is preferably 5 parts by mass or more and 200 parts by mass or less, particularly preferably 10 parts by mass or more and 100 parts by mass or less, per 100 parts by mass of the thermosetting resin.

The thermoplastic resin may be added in any form to the resin composition. For example, the thermoplastic resin may be particles having a weight average particle diameter of, for example, 0.01 µm or more and 200 µm or less, preferably 0.01 µm or more and 100 µm or less. The particles may have a core-shell structure. In this case, the core may be, for example, a polymer containing a unit derived from at least one monomer selected from the group consisting of n-, i-, and t-butyl(meth)acrylates, and may be a polymer containing a unit derived from a (meth)acrylate other than the above. The shell layer may be, for example, a copolymer of a monofunctional monomer, such as methyl(meth)acrylate, n-, i-, or t-butyl(meth)acrylate, or (meth)acrylic acid, and a polyfunctional monomer, such as 1,6-hexanediol diacrylate. Also, for example, a high-purity thermoplastic resin dispersed or dissolved in a solvent may be added to the resin compound.

Examples of the inorganic filler include silica such as fused silica, talc, calcium carbonate, titanium white, red iron oxide, silicon carbide, and boron nitride (BN). Preferred is a fused silica because of its inexpensive price. The average particle size of the inorganic filler is, for example, 0.01 µm or more and 100 µm or less. The amount of the inorganic filler is preferably 1 part by mass or more and 5000 parts by mass or less, more preferably 10 parts by mass or more and 3000 parts by mass, per 100 parts by mass of the thermosetting resin. The average particle size is a particle diameter at 50% cumulative volume in a volumetric particle size distribution (D50; this applies hereinafter).

Examples of the curing accelerator include, but not limited to, a modified imidazole-based curing accelerator, a modified aliphatic polyamine-based accelerator, and a modified polyamine-based accelerator. The curing accelerator is preferably used in the form of a reaction product (adduct) with a resin such as an epoxy resin. These may be used singly or in combination of two or more kinds thereof. In view of storage stability, the activation temperature of the curing accelerator is preferably 60° C. or higher, more preferably 80° C. or higher. The activation temperature is preferably 250° C. or lower, more preferably 180° C. or lower. The activation temperature herein refers to a temperature at which the curing of the thermosetting resin is accelerated rapidly by the action of the latent curing agent and/or the curing accelerator.

The amount of the curing accelerator differs depending on the kind of the curing accelerator. Usually, the amount is preferably 0.1 part by mass or more and 20 parts by mass or less, more preferably 1 part by mass or more and 10 parts by mass or less, per 100 parts by mass of the epoxy resin. When the curing accelerator is used in the form of an adduct, the amount of the curing accelerator means the net amount of the curing accelerator excluding the component (e.g., epoxy resin) other than the curing accelerator.

The polymerization initiator exhibits curability by irradiation with light and/or application of heat. The polymerization initiator may be, for example, a radical generator, an acid generator, or a base generator. Specific examples thereof include a benzophenone-based compound, a hydroxy ketone-based compound, an azo compound, an organic peroxide, and a sulfonium salt, such as aromatic sulfonium salt and aliphatic sulfonium salt. The amount of the polymerization initiator is preferably 0.1 part by mass or more and 20 parts by mass or less, more preferably 1 part by mass or more and 10 parts by mass or less, per 100 parts by mass of the epoxy resin.

The viscoelasticity (i.e., loss tangent tan $\delta$) of the flow control resin can be adjusted, for example, by its material. For example, changing the amount or the kind of the thermoplastic resin serving as the sheeting agent can change the loss tangent tan $\delta$. Specifically, using a phenoxy resin can easily lower the storage shear modulus G' and increase the tan $\delta$. The amount of the thermoplastic resin contained in the resin composition is preferably 5 parts by mass or more and 200 parts by mass or less, more preferably 10 parts by mass or more and 100 parts by mass or less, per 100 parts by mass of the thermosetting resin.

The sheet 4P may be a single layer composed of the flow control layer alone, may be a laminate of a plurality of layers including two or more flow control layers, and may be a laminate of a plurality of layers including one or more flow control layers and another layer (third layer). When the sheet 4P includes one or more flow control layers and one or more third layers, at least one flow control layer may be arranged to be the outermost layer of the sheet 4P. This tends to make it possible to achieve both the maintaining of the internal space S and the collective sealing.

The third layer may be formed of a resin composition similar to that forming the flow control layer. Note that the third layer preferably has physical properties that do not restrict the behavior of the flow control layer in the sealing step. For example, the third layer may have, at the temperature t, a loss tangent tan $\delta 3$ of 0.1 or more and 1.0 or less and a storage shear modulus G3' of $1\times10^4$ Pa or more and $1\times10^7$ Pa or less. The third layer may be a single layer or a laminate of a plurality of layers.

The sheet 4P may include a first layer 41P disposed on one outermost side and a second layer 42P adjacent to the first layer 41P. In this case, at least one of the first layer 41P and the second layer 42P corresponds to the flow control layer. In other words, the first layer is formed of a first resin composition containing a thermosetting resin, and the second layer is formed of a second resin composition containing a thermosetting resin. At least one of the first resin composition and the second resin composition has, at the temperature t, a loss tangent tan $\delta$ of 0.1 or more and 0.8 or less, and a storage shear modulus of $1\times10^4$ Pa or more and $1\times10^7$ Pa or less. In the sealing step, the first layer 41P is faced to the second circuit members 2.

In view of maintaining the internal space S which is variously shaped and arranged, the first resin composition and the second resin composition may both have the loss tangent tan $\delta$ and the storage shear modulus G' as described above.

In view of achieving both the maintaining of the internal space S and the collective sealing, the both layers may be the flow control layer, and the loss tangent tan $\delta$ at the temperature t of the first resin composition may be smaller than that of the second resin composition (tan $\delta 1$<tan $\delta 2$).

A description will be given below, with reference to an example where the first layer 41P and the second layer 42P are both the flow control layer, and tan $\delta 1$<tan $\delta 2$.
(First Layer)

The first layer 41P is disposed on one outermost side, and in the sealing step, is faced to the second circuit members 2.

At the temperature t, the loss tangent tan $\delta 1$ of the first resin composition (hereinafter, first resin) constituting the first layer 41P is 0.1 or more and 0.8 or less, and the storage shear modulus G1' is $1\times10^4$ Pa or more and $1\times10^7$ Pa or less.

The loss tangent tan δ1 may be 0.2 or more. The loss tangent tan δ1 may be 0.6 or less, and may be 0.4 or less. The storage shear modulus G1' may be $5 \times 10^4$ Pa or more, and may be $1 \times 10^5$ Pa or more. The storage shear modulus G1' may be $5 \times 10^6$ Pa or less, and may be $1 \times 10^6$ Pa or less.

In view of electrical insulation, the volumetric resistivity of the first layer 41P may be $1 \times 10^8$ Ω·cm or more, and may be $1 \times 10^{10}$ Ω·cm or more.

The thickness T1 of the first layer 41P is not limited. The thickness T1 may be 50 μm or less, may be 40 μm or less, and may be 30 μm or less. In this case, the entry between the second circuit members 2 is facilitated even when the separation distance therebetween is small, and the height of the mounting structure 10 tends to be reduced. In view of maintaining the internal space S, the thickness T1 may be 5 μm or more.

An elongation percentage E1 of the first resin is not limited. For example, an elongation percentage $E1_t$ at the temperature t of a layer formed of the first resin and having a thickness of 100 μm may be 1000% or more, and may be 1300% or more. This facilitates the entry of the first layer 41P between the second circuit members 2. The elongation $E1_t$ may be 3000% or less. An elongation percentage $E1_{25}$ at 25° C. of the above layer formed of the first resin may be, for example, 50% or more and 3000% or less.

The constitution of the first resin is not limited, but may be similar to that of the flow control resin (Second Layer)

The second layer 42P is adjacent to the first layer 41P. The second layer 42P satisfying tan δ1<tan δ2 has a function of suppressing the entry of the sheet 4P into the internal space S. In short, the second layer 42P controls the amount of the sheet 4P that enters the internal space S.

At the temperature t, the loss tangent tan δ2 of the second resin composition (hereinafter, second resin) constituting the second layer 42P is 0.1 or more and 0.8 or less, and the storage shear modulus G2' is $1 \times 10^4$ Pa or more and $1 \times 10^7$ Pa or less.

The loss tangent tan δ2 may be 0.2 or more, may be 0.3 or more, and may be 0.4 or more. The loss tangent tan δ2 may be 0.8 or less.

The difference between the loss tangent tan δ2 and the loss tangent tan δ1 is not limited. In view of achieving both the maintaining of the internal space S and the collective sealing, the difference between the loss tangent tan δ2 and the loss tangent tan δ1 may be 0.1 or more, and may be 0.2 or more. The difference between the loss tangent tan δ2 and the loss tangent tan δ1 may be 0.4 or less, and may be 0.3 or less.

The storage shear modulus G2' may be, for example, $10 \times 10^4$ Pa or more and $1 \times 10^6$ Pa or less.

The relationship in magnitude between the storage shear modulus G1' of the first resin and the storage shear modulus G2' of the second resin is not limited. The storage shear modulus G1' may be larger than the storage shear modulus G2' (G1'>G2'), G1' may be smaller than G2' (G1'<G2'), and G1' may be equal to G2' (G1'=G2'). In view of achieving both the maintaining of the internal space S and the collective sealing, G1' and G2' may satisfy G1'>G2'.

The thickness T2 of the second layer 42P is not limited. In view of more reliably maintaining the internal space S and improving the collective sealing, the thickness T2 may be 50 μm or more and 1470 μm or less, may be 970 μm or less, and may be 470 μm or less.

The constitution of the second resin is not limited, but may be similar to that of the flow control resin.

The volumetric resistivity of the second layer 42P is not limited. For example, it may be almost equal to or smaller than that of the first layer 41P.

An elongation percentage E2 of the second resin is not limited. For example, an elongation percentage $E2_t$ at the temperature t of a layer formed of the second resin and having a thickness of 100 μm may be smaller than that of the layer formed of the first resin. The elongation percentage $E2_t$ may be, for example, 50% or more, and may be 200% or more. The elongation percentage $E2_t$ may be 1000% or less, and may be 500% or less. An elongation percentage $E2_{25}$ at 25° C. of the above layer formed of the second resin may be, for example, 50% or more and 3000% or less.

[Manufacturing Method of Mounting Structure]

Figure 3:
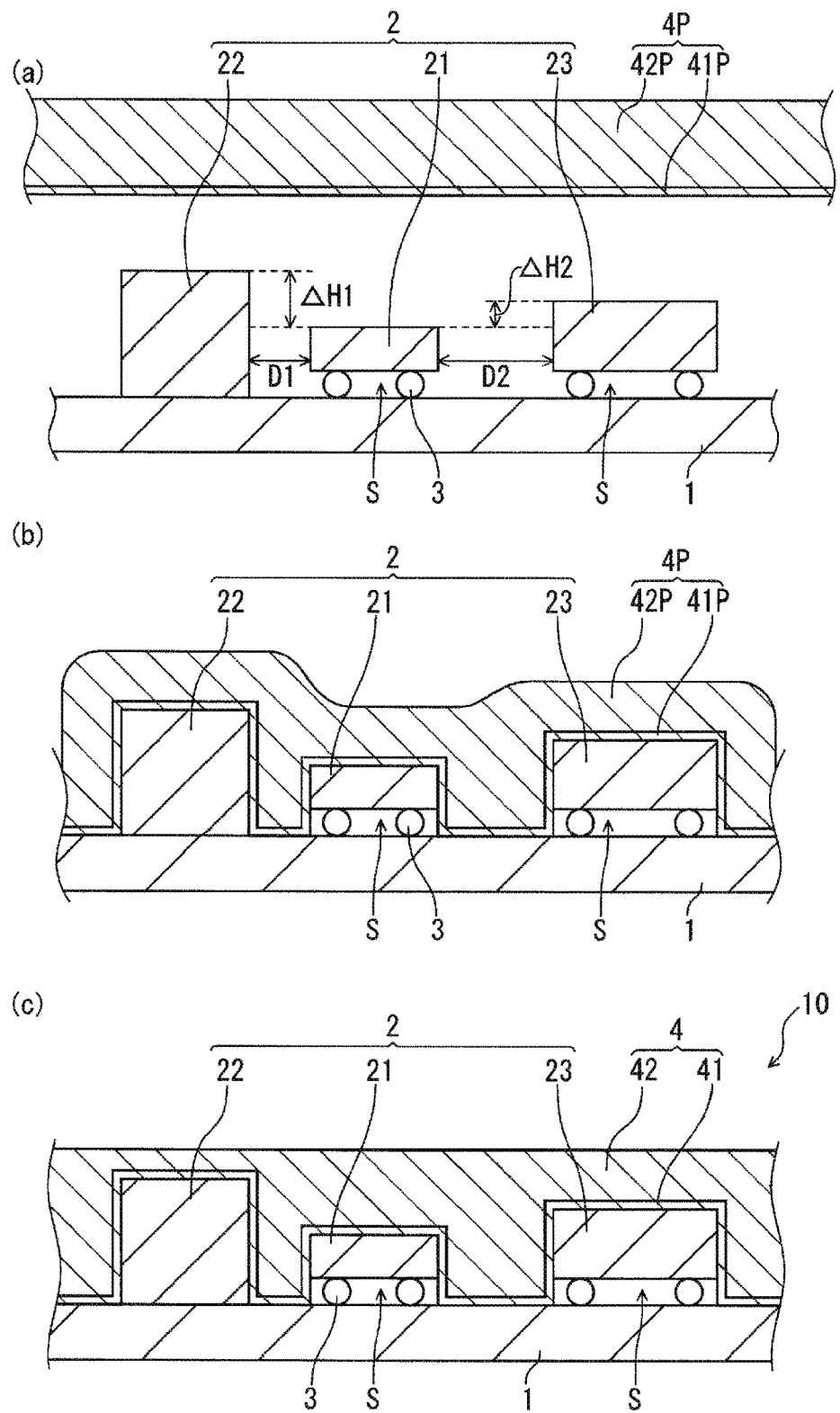
FIG. 3 A set of schematic diagrams for explaining a manufacturing method according to an embodiment of the present invention by way of cross sections of a mounting member or the mounting structure.

A manufacturing method according to the present embodiment will be described below, with reference to FIG. 3. FIG. 3 is a set of schematic diagrams for explaining a manufacturing method according to the present embodiment by way of cross sections of a mounting member or a mounting structure 10.

The mounting structure 10 is manufactured by a method including: a member preparation step of preparing a mounting member including a first circuit member 1 and a plurality of second circuit members 2 placed on the first circuit member 1; a sheet preparation step of preparing a sheet 4P having thermosetting property; a disposing step of disposing the sheet 4P on the mounting member so as to face the second circuit members 2; and a sealing step of pressing the sheet 4P against the first circuit member 1 and heating the sheet 4P, to seal the second circuit members 2 and cure the sheet 4P.

Each of the steps will be described below, with reference to an example where the sheet 4P includes the first layer 41P and the second layer 42P.

(Member Preparation Step)

A mounting member including a first circuit member 1 and a plurality of the second circuit members 2 placed on the first circuit member 1 is prepared (FIG. 3(a)).

The first circuit member 1 is, for example, at least one selected from the group consisting of a semiconductor element, a semiconductor package, a glass substrate, a resin substrate, a ceramic substrate, and a silicon substrate. The first circuit member 1 may have at its surface an electrically conductive material layer, such as ACF (anisotropic conductive film) or ACP (anisotropic conductive paste). The resin substrate may be a rigid resin substrate or a flexible resin substrate, examples of which include an epoxy resin substrate (e.g., glass epoxy substrate), a bismaleimide triazine substrate, a polyimide resin substrate, and a fluororesin substrate. The first circuit member 1 may be a component built-in substrate in which a semiconductor chip and the like are incorporated.

The second circuit members 2 include a reference member 21, a first adjacent member 22 adjacent to the reference member 21, and a second adjacent member 23 adjacent to the reference member 21. A separation distance D1 between the reference member 21 and the first adjacent member 22 is different from a separation distance D2 between the reference member 21 and the second adjacent member 23. A height ΔH1 from the reference member 21 of the first adjacent member 22 may be different from a height ΔH2 from the reference member 21 of the second adjacent member 23.

The height ΔH is a height of the highest portion of a member adjacent to the reference member 21, relative to the highest point of the reference member 21 when viewed from the principal surface of the first circuit member 1 (the point where the distance from the first circuit member 1 is largest), and is a value to be seen as reflecting whether it is higher or lower than the reference member 21. For example, in the case where the first adjacent member 22 is higher than the reference member 21, and the second adjacent member 23 is lower than the reference member 21, even when the difference in height between the first adjacent member 22 and the reference member 21 is equal to that between the second adjacent member 23 and the reference member 21, the height ΔH1 is different from the height ΔH2. Moreover, for example, in the case where the first adjacent member 22 has the same height as the reference member 21 (ΔH1=0), and the second adjacent member 23 is higher (or lower) than the reference member 21, the height ΔH1 is different from the height ΔH2.

When the separation distance D2 is larger than the separation distance D1, the ratio of the separation distance D2 to the separation distance D1 may be 200% or more, and may be 300% or more. According to the sheet 4P, even though there is a great difference in the separation distance as above, these second circuit members 2 can be collectively sealed. The separation distance D is a shortest distance between the reference member 21 and a member adjacent thereto (in the illustrated example, the adjacent member 22 or 23) when viewed from the direction normal to the principal surface of the first circuit member 1.

The separation distance D is set as appropriate according to the size of the first circuit member 1, the number, size and how to place of the second circuit members 2, and the like, and is not limited. The lower limit of the separation distance D may be set as appropriate according to the thickness of the sheet 4P, and may be, for example, 100% or more and 4000% or less of the thickness T of the sheet 4P. When the separation distance D is within the range above with respect to the thickness T of the sheet 4P, the sheet 4P can easily enter the gap therebetween. The separation distance D may be, for example, 50 μm or more and 6 mm or less, may be 50 μm or more and 2000 μm or less, and may be 100 μm or more and 1500 μm or less.

When the first adjacent member 22 is higher than the second adjacent member 23, the ratio of the height of the first adjacent member 22 to that of the second adjacent member 23 may be 200% or more, and may be 300% or more. According to the sheet 4P, even when there is a great difference in height, these second circuit members 2 can be collectively sealed. The height of the first adjacent member 22 is a distance measured to a farthest point from the first circuit member 1 of the first adjacent member 22; the height of the second adjacent member 23 is a distance measured to a farthest point from the first circuit member 1 of the second adjacent member 23.

The second circuit members 2 include a hollow member placed on the first circuit member 1, with the bumps 3 interposed therebetween (in the illustrated example, the reference member 21 and the second adjacent member 23). An internal space S is formed between the first circuit member 1 and the hollow member. The hollow member is an electronic component that requires to be sealed (hollow-sealed) with the internal space S maintained. Examples of the hollow member include RFIC, SAW, sensor chip (e.g., acceleration sensor), piezoelectric oscillator chip, quartz oscillator chip, and MEMS device. Examples of the second circuit members 2 other than the hollow member include FBAR, BAW, chip multilayer LC filter, dielectric filter, and multi-layered ceramic capacitor (MLCC).

In short, the mounting member may have various structures in which the second circuit members 2 are placed on various kinds of the first circuit member 1, such as a chip-on-board (CoB) structure (including chip-on-wafer (CoW), chip-on-film (CoF), and chip-on-glass (CoG)), a chip-on-chip (CoC) structure, a chip-on-package (CoP) structure, or a package-on-package (PoP) structure. The mounting member may be a multi-layered mounting member in which, for example, on the first circuit member 1 with the second circuit members 2 placed thereon, the first member and/or the second circuit members 2 are further placed.

The bumps 3 have electrical conductivity, and the first circuit member 1 and the second circuit member 2 are electrically connected to each other via the bumps 3. The height of the bumps 3 is not limited, but may be, for example, 5 μm or more and 150 μm or less. The material of the bumps 3 is also not limited as long as it has electrical conductivity. Examples of the material include copper, gold, and solder balls.

(Sheet Preparation Step)

The sheet 4P including a first layer 41P and a second layer 42P is prepared (FIG. 3(a)).

The method of producing the sheet 4P in the form of a laminate is not limited. The sheet 4P may be formed by separately forming each layer and laminating the layers together (laminating method), or by sequentially applying a material of each layer (coating method).

In the laminating method, each layer is formed by a process including, for example, a step of preparing a solvent paste or solvent-free paste containing the above resin composition (hereinafter, simply collectively referred to as paste), and a step (forming step) of foming each layer from the paste. The first layer 41P and the second layer 42P are each formed through the above process, and then laminated in this order. When the paste contains a pre-gelling agent, gelation is carried out during the forming step. The gelation is carried out after a paste is formed into a thin film, by heating the thin film at a temperature lower than the curing temperature of the thermosetting resin (e.g., at 70° C. or higher and 150° C. or lower) for 1 min or more and 10 min or less.

On the other hand, in the coating method, for example, the first layer 41P is formed through the above process, which is followed by applying a paste containing the second resin composition onto a surface of the first layer 41P, to form the second layer 42P. In this case also, gelation can be carried out during the Riming step. The gelation may be carried out one after another for each paste formed into a thin film, and may be carried out after the thin films are formed into a laminate.

Each layer (thin film) may be formed using, for example, a die, a roll coater, or a doctor blade. In this case, the paste is preferably adjusted to have a viscosity of 10 mPa·s or more and 10,000 mPa·s or less. When a solvent paste is used, the film may be dried at a temperature of 70° C. or higher and 150° C. or lower for 1 min or more and 10 min or less, thereby to remove the solvent. The gelation and the removal of the solvent can be carried out simultaneously.

The sheet 4P in the form of a single layer can be formed in a similar manner to the above thin film.

(Disposing Step)

The sheet 4P is disposed onto the mounting member such that the first layer 41P faces the second circuit members 2. At this time, the plurality of the second circuit members 2 are covered with one piece of the sheet 4P.

(Sealing Step)

The sheet 4P is pressed against the first circuit member 1 (FIG. 3(b)), and the sheet 4P is heated. This can seal the second circuit members 2 so as to maintain the internal space S. The sheet 4P is cured simultaneously with sealing of the second circuit members 2, or after the second circuit members 2 are sealed (FIG. 3(c)).

The pressing of the sheet 4P against the first circuit member 1 is performed, for example, while heating the sheet 4P at a temperature lower than the curing temperature of the thermosetting resin contained in the sheet 4P (hot pressing). In this way, the second circuit members 2 are sealed. At this time, the sheet 4P comes in close contact with the surfaces of the second circuit members 2, and extends until it reaches the surface of the first circuit member 1 between the second circuit members 2. This improves the reliability of sealing of the second circuit members 2.

The hot pressing may be performed under atmospheric pressure, and may be performed under a reduced pressure atmosphere (e.g., 50 Pa or more and 50,000 Pa or less, preferably 50 Pa or more and 3,000 Pa or less). The heating conditions during pressing are not limited, but may be set as appropriate according to the pressing method and the kind of the thermosetting resin. The heating is performed, for example, at 40° C. or higher and 200° C. or lower (preferably 50° C. or higher and 180° C. or lower) for 1 sec or more and 300 min or less (preferably 3 sec or more and 300 min or less).

Subsequently, the sheet 4P is heated at the above curing temperature to cure the thermosetting resin in the sheet 4P, to form the sealing material 4. The conditions for heating the sheet 4P (curing the thermosetting resin) may be set as appropriate according to the kind of the thermosetting resin. The curing of the thermosetting resin is performed, for example, at 50° C. or higher and 200° C. or lower (preferably 120° C. or higher and 180° C. or lower) for 1 sec or more and 300 min or less (preferably, 60 min or more and 300 min or less).

The hot pressing and the curing of the thermosetting resin may be performed separately or simultaneously. For example, after the hot pressing is performed at a temperature lower than the curing temperature of the thermosetting resin contained in the sheet 4P under a reduced pressure atmosphere, the reduced pressure is released, and heating may be performed at a higher temperature under atmospheric pressure, to cure the thermosetting resin. Alternatively, after the hot pressing is performed at a temperature lower than the curing temperature of the thermosetting resin contained in the sheet 4P under atmospheric pressure, heating may be performed at a higher temperature, to cure the thermosetting resin. Alternatively, the hot pressing may be performed at the curing temperature under a reduced pressure atmosphere, to cure the thermosetting resin during pressure reduction.

In the manner as above, the mounting structure 10 can be obtained, the mounting structure including: a mounting member including the first circuit member 1, and the plurality of the second circuit members 2 placed on the first circuit member 1; and a sealing material sealing the mounting member.

EXAMPLES

The present invention will be more specifically described below, with reference to Examples. It is to be noted, however, that the following Examples do not limit the present invention.

Example 1

(1) Production of Sheet 4P

A sheet X1 (thickness: 250 μm) in the form of a single layer was produced by the coating method, using the following resin composition (flow control resin X1).
(Flow Control Resin X1)
Epoxy resin (thermosetting resin): 100 parts
Phenol novolac (curing agent): 80 parts
Acrylic resin (thermoplastic resin): 50 parts
Fused spherical silica (inorganic filler): 400 parts
Imidazole (curing accelerator): 2 parts At a temperature t (100° C.) when the SAW chips were sealed, the elongation percentage of the flow control resin X1 was 400%, the loss tangent tan δ was 0.5, and the storage shear modulus G' was $7 \times 10^4$ Pa. The elongation percentage at 25° C. of the flow control resin X1 was 200%. The elongation percentage was measured using a layer formed from the flow control resin X1 into a thickness of 100 μm.

(2) Production of Mounting Member

The same model of three SAW chips A to C (second circuit members, each 1.1 mm×1.1 mm and 0.2 mm in height) were arranged in this order and placed on a glass substrate (a first circuit member, 50 mm square and 0.2 mm thick), with gold bumps (each 100 μm in diameter and 20 μm in height) interposed therebetween, to obtain a mounting member. The separation distance D1 between the SAW chip A and the SAW chip B was 0.4 mm, and the separation distance D2 between the SAW chip B and the SAW chip C was 0.1 mm.

(3) Production of Mounting Structure

The obtained mounting member was sealed with the sheet X1, to obtain a mounting structure. The sealing was performed under a reduced pressure atmosphere (400 Pa) while heating the sheet X1 at 100° C.

(4) Evaluation of Collective Sealing

The obtained mounting structure was observed with an optical microscope from the glass substrate side, and evaluated according to the following criteria. The results are shown in Table 1.

Excellent: A sufficiently large internal space is formed between all the SAW chips and the glass substrate. In addition, the resin is filled without voids between the SAW chip A and the SAW chip B and between the SAW chip B and the SAW chip C.

Good*[1]: A sufficiently large internal space is formed between all the SAW chips and the glass substrate. In addition, the resin is filled between the SAW chip A and the SAW chip B and between the SAW chip B and the SAW chip C, but a small void is observed between the SAW chip B and the SAW chip C.

Good*[2]: The resin is filled between the SAW chip A and the SAW chip B and between the SAW chip B and the SAW chip C. In addition, a sufficiently large internal space is formed between all the SAW chips and the glass substrate, but the size of the internal space (the amount of resin having entered) varies among the SAW chip A, the SAW chip B, and the SAW chip C.

Bad: The resin is filled between the SAW chip A and the SAW chip B and between the SAW chip B and the SAW chip C. However, the resin has entered between the SAW chip A and the glass substrate and between the SAW chip B and the glass substrate, failing to form a sufficiently large space therebetween.

Example 2

A mounting structure was manufactured and evaluated in the same manner as in Example 1, except that a sheet X2 having a first layer X21 (12 μm) and a second layer X22 (250 μm) was used. The results are shown in Table 1.

The sheet X2 was produced by the coating method, using the following resin composition (first resin X21, second resin X22).

(First Resin X21)
  Epoxy resin (thermosetting resin): 100 parts
  Phenol novolac (curing agent): 60 parts
  Acrylic resin (thermoplastic resin): 60 parts
  Fused spherical silica (inorganic filler): 100 parts
  Iimidazole (curing accelerator): 2 parts (Second Resin X22)
  Epoxy resin (thermosetting resin): 100 parts
  Phenol novolac (curing agent): 80 parts
  Acrylic resin (thermoplastic resin): 50 parts
  Fused spherical silica (inorganic filler): 400 parts
  Imidazole (curing accelerator): 2 parts At the temperature t (100° C.) when the SAW chips were sealed, the elongation percentage of the first resin X21 was 1400%, the loss tangent tan δ1 was 0.2, and the storage shear modulus G1' was $1 \times 10^5$ Pa. At the temperature t, the elongation percentage of the second resin X22 was 400%, the loss tangent tan δ2 was 0.5, and the storage shear modulus G2' was $7 \times 10^4$ Pa. At 25° C., the elongation percentage of the first resin X21 was 300%, and the elongation percentage of the second resin X22 was 200%. The elongation percentage was measured using a layer formed from the first resin X21 and the second resin X22 into a thickness of 100 μm.

In addition, in sealing, the speeds (entry speeds) of the sheet X2 entering between the SAW chip A and the SAW chip B and between the SAW chip B and the SAW chip C were each measured. The entry speed was determined by taking out the mounting member every two seconds after the heating of the sheet X2 had started, and observing the height from the glass substrate of the sheet X2, with an optical microscope having height measuring function, from the side faces of the SAW chips. The entry speed was determined as an average speed until the sheet X2 reached the glass substrate.

The entry speed between the SAW chips A and B of the sheet X2 was 110 μm/sec and the entry speed between the SAW chips B and C was 16 μm/sec. This result shows that the entry speed of the sheet X2 increases with increase in the distance between the chips, and the distance between the chips influences the behavior of the sheet X2 in the sealing step.

Example 3

A mounting structure was manufactured and evaluated in the same manner as in Example 1, except that a sheet X3 having a first layer X31 (40 μm) and a second layer X32 (250 μm) was used. The results are shown in Table 1.

The sheet X3 was produced by the coating method, using the following resin composition (first resin X31, second resin X32).

(First Resin X31)
  Epoxy resin (thermosetting resin): 100 parts
  Phenol novolac (curing agent): 60 parts
  Acrylic resin (thermoplastic resin): 20 parts
  Fused spherical silica (inorganic filler): 250 parts
  (imidazole (curing accelerator): 2 parts (Second Resin X32)
  Epoxy resin (thermosetting resin): 100 parts
  Phenol novolac (curing agent): 60 parts
  Acrylic resin (thermoplastic resin): 25 parts
  Fused spherical silica (inorganic filler): 900 parts
  Imidazole (curing accelerator): 2 parts At the temperature t (100° C.) when the SAW chips were sealed, the elongation percentage of the first resin X31 was 2000%, the loss tangent tan δ1 was 0.4, and the storage shear modulus G1' was $4 \times 10^4$ Pa. At the temperature t, the elongation percentage of the second resin X32 was 300%, the loss tangent tan δ2 was 0.7, and the storage shear modulus G2' was $5 \times 10^5$ Pa. At 25° C., the elongation percentage of the first resin X31 was 600%, and the elongation percentage of the second resin X32 was 50%.

Comparative Example 1

A mounting structure was manufactured and evaluated in the same manner as in Example 1, except that a sheet Y1 having a first layer Y11 (15 μm) and a second layer Y12 (250 μm) was used. The results are shown in Table 1.

The sheet Y1 was produced by the coating method, using the following resin composition (first resin Y11, second resin Y12).

(First Resin Y11)
  Epoxy resin (thermosetting resin): 100 parts
  Phenol novolac (curing agent): 60 parts
  Phenoxy resin (thermoplastic resin): 20 parts
  Fused spherical silica (inorganic filler): 250 parts
  Imidazole (curing accelerator): 2 parts (Second Resin Y12)
  Epoxy resin (thermosetting resin): 100 parts
  Phenol novolac (curing agent): 60 parts
  Phenoxy resin (thermoplastic resin): 35 parts
  Fused spherical silica (inorganic filler): 340 parts
  Imidazole (curing accelerator): 2 parts At the temperature t (100° C.) when the SAW chips were sealed, the elongation percentage of the first resin Y11 was 100%, the loss tangent tan δ1 was 1.1, and the storage shear modulus G1' was $5 \times 10^4$ Pa. At the temperature t, the elongation percentage of the second resin Y12 was 100%, the loss tangent tan δ2 was 1.0, and the storage shear modulus G2' was $6 \times 10^4$ Pa. At 25° C., the elongation percentage of the first resin Y11 was 50%, and the elongation percentage of the second resin Y12 was 50%.

TABLE 1

| | Sheet X1 | Sheet X2 | | Sheet X3 | | Sheet Y1 | |
|---|---|---|---|---|---|---|---|
| | Single layer | 1st layer | 2nd layer | 1st layer | 2nd layer | 1st layer | 2nd layer |
| Thickness (μm) | 250 | 12 | 250 | 40 | 250 | 15 | 250 |
| Temperature t  Elongation (%) | 400 | 1400 | 400 | 2000 | 300 | 100 | 100 |
| tanδ | 0.5 | 0.2 | 0.5 | 0.4 | 0.7 | 1.1 | 1.0 |
| G' | $7 \times 10^4$ | $1 \times 10^5$ | $7 \times 10^4$ | $4 \times 10^4$ | $5 \times 10^5$ | $5 \times 10^4$ | $6 \times 10^4$ |
| Collective sealing | Good*2 | Excellent | | Good*1 | | Bad | |

INDUSTRIAL APPLICABILITY

According to the manufacturing method of the present invention, a plurality of circuit members placed at different intervals can be collectively sealed so as to maintain the internal space. The manufacturing method is therefore applicable for manufacturing various mounting structures.

REFERENCE SIGNS LIST

10: mounting structure
1: first circuit member
2: second circuit member
  21: reference member
  22: first adjacent member
  23: second adjacent member
3: bump
4: sealing material (cured product of sheet)
  41: first cured layer (first layer after curing)
  42: second cured layer (second layer after curing)
4P: sheet
  41P: first layer
  42P: second layer

The invention claimed is:

1. A manufacturing method of a mounting structure, the method comprising:
  a step of preparing a mounting member including a first circuit member and a plurality of second circuit members placed on the first circuit member, the second circuit members including a reference member and a first adjacent member and a second adjacent member each adjacent to the reference member, wherein at least one of the plurality of second circuit members is a hollow member provided with a space from the first circuit member, and wherein a separation distance D1 between the reference member and the first adjacent member is different from a separation distance D2 between the reference member and the second adjacent member;
  a step of preparing a sheet having a thermosetting property, the sheet including a first layer disposed on one outermost side of the sheet and a second layer adjacent to the first layer, wherein the first layer is formed of a first resin composition containing a thermosetting resin and the second layer being formed of a second resin composition containing a thermosetting resin, and wherein a loss tangent tan δ of the first resin composition at a sealing temperature t is smaller than a loss tangent tan δ of the second resin composition at the sealing temperature t with a difference between the loss tangent tan δ of the first resin composition at the sealing temperature t and the loss tangent tan δ of the second resin composition at the sealing temperature t is at least 0.1;
  a disposing step of disposing the sheet on the mounting member such that the first layer of the sheet faces the second circuit members; and
  a sealing step of pressing the sheet disposed on the mounting member against the first circuit member and heating the sheet to the sealing temperature t to seal the second circuit members and to cure the sheet such that the sheet enters both the separation distance D1 between the reference member and the first adjacent member and the separation distance D2 between the second adjacent member and the reference member to seal the second circuit members while maintaining the space between the hollow member and the first circuit member, wherein
  the second circuit members include a reference member, and a first adjacent member and a second adjacent member each adjacent to the reference member,
  a separation distance D1 between the reference member and the first adjacent member is different from a separation distance D2 between the reference member and the second adjacent member,
  at least one of the plurality of the second circuit members is a hollow member to be provided with a space from the first circuit member,
  the sheet includes a first layer being disposed on one outermost side and facing the second circuit members, and a second layer adjacent to the first layer,
  the first layer being formed of a first resin composition containing a thermosetting resin.

2. The manufacturing method of claim 1, wherein at least one of the first resin composition and the second resin composition has, at the sealing temperature t, a loss tangent tan δ of 0.1 or more and 0.8 or less, and a storage shear modulus of $1 \times 10^4$ Pa or more and $1 \times 10^7$ Pa or less.

3. The manufacturing method of claim 2, wherein
  the first resin composition and the second resin composition both have, at the sealing temperature t, a loss tangent tan δ of 0.1 or more and 0.8 or less, and a storage shear modulus of $1 \times 10^4$ Pa or more and $1 \times 10^7$ Pa or less, a layer formed of the first resin composition and having a thickness of 100 μm has an elongation percentage at the sealing temperature t of 1000% or more, and the first layer has a thickness of 50 μm or less.

4. The manufacturing method of claim 1, wherein a height difference ΔH1 between the reference member and the first adjacent member is different from a height difference ΔH2 between the reference member and the second adjacent member.

* * * * *